(12) United States Patent
Perng et al.

(10) Patent No.: US 10,676,824 B2
(45) Date of Patent: Jun. 9, 2020

(54) ENCLOSED-CHANNEL REACTOR SYSTEM WITH CONDUIT PLATE

(71) Applicant: National Tsing Hua University, Hsinchu (TW)

(72) Inventors: Tsong-Pyng Perng, Hsinchu (TW); Chi-Chung Kei, Hsinchu (TW); Chien-Pao Lin, Hsinchu (TW); Mrinalini Mishra, Hsinchu (TW); Sheng-Hsin Huang, Hsinchu (TW); Kuang-I Liu, Hsinchu (TW); Yu-Hsuan Yu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 269 days.

(21) Appl. No.: 15/131,297

(22) Filed: Apr. 18, 2016

(65) Prior Publication Data

US 2017/0175268 A1 Jun. 22, 2017

(30) Foreign Application Priority Data

Dec. 18, 2015 (TW) .............................. 104142673 A

(51) Int. Cl.
*C23C 16/00* (2006.01)
*C23C 16/455* (2006.01)

(52) U.S. Cl.
CPC .. *C23C 16/45559* (2013.01); *C23C 16/45502* (2013.01); *C23C 16/45544* (2013.01)

(58) Field of Classification Search
CPC ........ C23C 16/45559; C23C 16/45502; C23C 16/45544; C23C 16/45563; C23C 16/45565; C23C 16/045; C23C 14/046
See application file for complete search history.

(56) References Cited

U.S. PATENT DOCUMENTS

| 5,738,908 | A | * | 4/1998 | Rey | ........................ | C04B 35/565 |
|---|---|---|---|---|---|---|
| | | | | | | 427/249.2 |
| 5,851,294 | A | * | 12/1998 | Young | ............... | C23C 16/45508 |
| | | | | | | 118/715 |
| 6,093,252 | A | * | 7/2000 | Wengert | ................... | B01J 3/006 |
| | | | | | | 118/715 |

(Continued)

FOREIGN PATENT DOCUMENTS

TW 201512452 * 4/2015 ........... C23C 16/455

OTHER PUBLICATIONS

English translation TW 201512452, Kei, Apr. 2015 (Year: 2015).*

*Primary Examiner* — Keath T Chen
(74) *Attorney, Agent, or Firm* — Mintz Levin Cohn Ferris Glovsky and Popeo, P.C.; Peter F. Corless; Steven M. Jensen

(57) ABSTRACT

An enclosed-channel reactor system is provided, which includes: a reactor body having a plurality of enclosed channels therein; an upper cap disposed at one end of the reactor body and having an inlet port communicating with the plurality of enclosed channels; a lower cap disposed at the other end of the reactor body opposite to the upper cap and having an outlet port communicating with the plurality of enclosed channels; and at least a conduit plate disposed between the upper cap and the reactor body for guiding a precursor injected from the inlet port into the plurality of enclosed channels uniformly.

17 Claims, 16 Drawing Sheets

(1 of 16 Drawing Sheet(s) Filed in Color)

(56) References Cited

U.S. PATENT DOCUMENTS

| | | | | |
|---|---|---|---|---|
| 2001/0027026 A1* | 10/2001 | Dhindsa | ............... | C23C 16/455 |
| | | | | 438/712 |
| 2004/0211419 A1* | 10/2004 | Eason | ............... | A61M 15/0028 |
| | | | | 128/203.15 |
| 2008/0069955 A1* | 3/2008 | Hong | ................... | C23C 16/045 |
| | | | | 427/255.28 |
| 2008/0081114 A1* | 4/2008 | Johanson | ......... | C23C 16/45565 |
| | | | | 427/273 |
| 2008/0124462 A1* | 5/2008 | Waghray | ............... | C04B 35/83 |
| | | | | 427/249.2 |
| 2010/0272892 A1* | 10/2010 | Kobayashi | ....... | C23C 16/45574 |
| | | | | 427/255.5 |
| 2011/0308458 A1* | 12/2011 | Sung | ............... | C23C 16/45565 |
| | | | | 118/719 |
| 2014/0238244 A1* | 8/2014 | Chin | ................... | B01D 46/444 |
| | | | | 96/399 |

* cited by examiner

ENCLOSED-CHANNEL REACTOR SYSTEM WITH CONDUIT PLATE

CROSS-REFERENCE TO RELATED APPLICATION

This application claims under 35 U.S.C. § 119(a) the benefit of Taiwanese Patent Application No. 104142673 filed Dec. 18, 2015, the entire contents of which are incorporated herein by reference.

BACKGROUND OF THE INVENTION

1. Field of the Invention

The present invention relates to reactor systems for chemical vapor reaction, and more particularly, to an enclosed-channel reactor system with a conduit plate using an atomic layer deposition (ALD) technology.

2. Description of Related Art

In order to increase chemical reaction rates, catalysts are typically applied in production to improve the yields. In a reaction process, a chemical reaction rate is positively correlated with the contact area between a catalyst and a reactant. Therefore, the catalysts that are used nowadays generally have particle sizes of nanoscale, so as to increase the reaction area.

Further, in the field of atomic layer deposition (ALD) technology, conventional ALD systems can be classified as perpendicular-flow or cross-flow reactors, however, the processing equipment of ADL systems are mostly applied to a process for growing a thin film on a planar substrate, instead of depositing a nanocatalyst on a large-sized complex structure. For example, to deposit nanocatalyst on carbon nanotubes that are coated on a silicon substrate, since the precursor is transported by diffusion within the nanostructure in the conventional ALD system, if the pulse time or partial pressure of the precursor is not sufficient, the precursor cannot diffuse into a deep portion of the nanostructure. As such, deposition only extends to a depth of approximately 2 μm below the surface of the carbon nanotubes, and no deposition occurs at a lower portion of the carbon nanotubes.

In other words, a uniformly-deposited thin film is difficult to form on a nanostructured substrate having a high aspect ratio, and most of the precursor cannot diffuse into the nanostructured substrate, and thereby resulting in poor uniformity and more waste of the precursor and consequently increasing the fabrication cost.

Therefore, there is an urgent need to provide a reactor system to overcome the above-described drawbacks.

SUMMARY OF THE INVENTION

In view of the above-described drawbacks, the present invention provides an enclosed-channel reactor system with a conduit plate, which includes: a reactor body having a plurality of enclosed channels; an upper cap disposed at one end of the reactor body, and having an inlet port communicating with the plurality of enclosed channels; a lower cap disposed at the other end of the reactor body and opposite to the upper cap, and having an outlet port communicating with the plurality of enclosed channels; at least two O-rings disposed between the reactor body and the upper cap and between the reactor body and the lower cap, respectively, for enhancing the sealing tightness; and a first conduit plate disposed between the upper cap and the reactor body for guiding a precursor injected from the inlet port into the plurality of enclosed channels uniformly.

In an embodiment, the first conduit plate includes: a plate body having an upper surface and a lower surface opposite to the upper surface; a plurality of through holes penetrating the upper surface and the lower surface of the plate body; and a plurality of conduits concavely formed on the upper surface of the plate body and communicating with the inlet port of the upper cap and the plurality of through holes.

In another embodiment, the first conduit plate includes: a plate body having an upper surface and a lower surface opposite to the upper surface; a through hole penetrating the upper surface and the lower surface of the plate body; and a plurality of conduits concavely formed on the lower surface of the plate body in a radial or fishbone arrangement, and each having one end communicating with a corresponding one of the plurality of enclosed channels of the reactor body and the other end communicating with the through hole.

In a further embodiment, the system further includes a second conduit plate, which includes: a plate body having an upper surface and a lower surface opposite to the upper surface; a plurality of through holes penetrating the upper surface and the lower surface of the plate body; and a plurality of conduits concavely formed on the upper surface of the plate body, wherein the second conduit plate is disposed between the first conduit plate and the reactor body, and the number of the conduits of the second conduit plate is greater than the number of the conduits of the first conduit plate.

In an embodiment, the system further includes a convergence plate, which includes: a plate body having an upper surface and a lower surface opposite to the upper surface; and a through hole positioned at a center of the plate body and penetrating the upper surface and the lower surface of the plate body; wherein the convergence plate is disposed between the upper cap and the first conduit plate.

The enclosed-channel reactor system and the conduit plate thereof according to the present invention allow the precursor to be guided into the enclosed channels uniformly. As such, collisions of precursor molecules with substrates are increased to enhance reactivity and reduce pulse time. Also, the present invention improves the diffusion efficiency of the precursor, and increases the reaction rates. Furthermore, the present invention reduces the consumption of precursor, and consequently reduces the fabrication cost. In addition, the present invention is applicable to a nanostructured substrate having a high aspect ratio for uniform plating of thin films.

BRIEF DESCRIPTION OF DRAWINGS

The patent or application filed contains at least one drawing or photograph executed in color. Copies of this patent or patent application publication with color drawing(s) or Photograph(s) will be provided by the Patent and Trademark Office upon request and payment of the necessary fee.

FIG. 4B' is a cross-sectional schematic view according to another embodiment of FIG. 4B;

FIG. 4C' is a cross-sectional schematic view according to another embodiment of FIG. 4C;

DETAILED DESCRIPTION OF PREFERRED EMBODIMENTS

The following specific embodiments are provided to illustrate the disclosure of the present invention, these and other advantages and effects can be apparent to those skilled in the art after reading this specification, and can also be implemented or applied by other different embodiments. Therefore, any parts in any of the specific examples encompassed by the present invention below can be combined with any parts in any other examples.

It should be noted that the structures, proportions, sizes, etc. illustrated in the figures appended to the present specification are all merely used for coping with the content of disclosure of the present specification, so as to enhance the understanding and perusal of one skilled in the art. They are not used to limit the implemental limitations of the present invention, such that they lack substantial technical meanings. Without affecting the effect brought about and the goals to be achieved by the present invention, any modification of a structure, alteration of a proportion or adjustment of a size should still fall within the scope of the technical content disclosed in the present invention. At the same time, terms used in the present specification are merely for the clarity of the descriptions, rather than limit the implemental scope of the present invention. Without substantially altering the technical content, an alteration or adjustment of relative positioning can also be regarded as an implemental scope of the present invention.

The present invention uses the ALD technology to prepare catalysts. A precursor is supplied in batches into an enclosed-channel reactor for reaction, and a large amount of gas, such as $N_2$ or Ar, that does not participate in the reaction is applied to dilute or remove the precursor. Various dilution or removal steps can be further applied or repeated to control the particle size of a catalyst, the thickness of a support material, and proportions of materials to be mixed. For example, to introduce two precursors A and B and a gas P, a cycle with sequential injections of A-P-B-P steps is repeated. The cycle number is chosen for controlling the nanoparticle size of a deposited catalyst or the thickness of a support material, so as to achieve an optimal catalyst reaction efficiency.

Figure 1A:
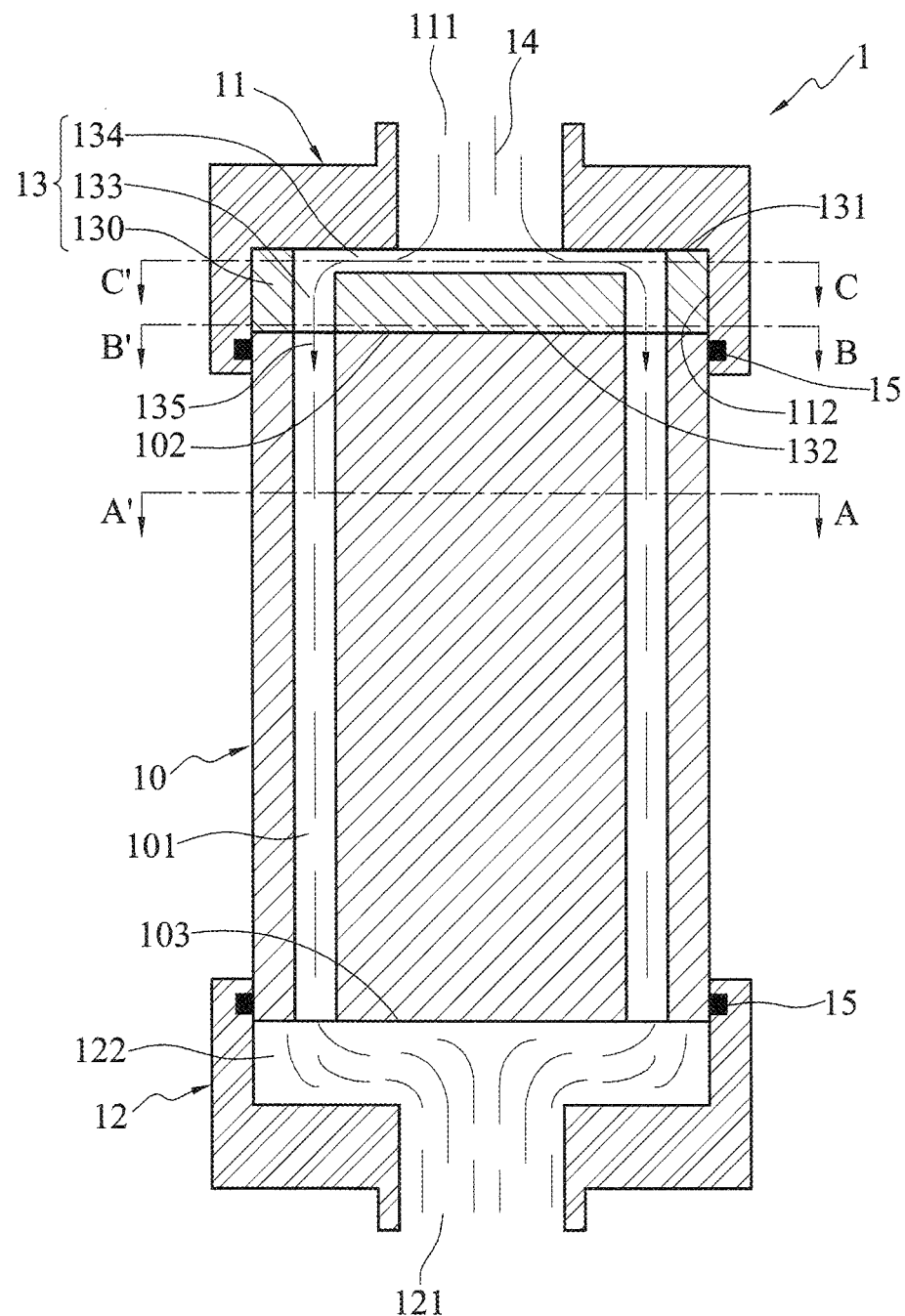
FIG. 1A is a schematic view of an enclosed-channel reactor system according to a first embodiment of the present invention.

FIG. 1A is a schematic view of an enclosed-channel reactor system 1 according to a first embodiment of the present invention. Referring to FIG. 1A, the system 1 has a reactor body 10, an upper cap 11 and a lower cap 12, and at least a first conduit plate 13. The reactor body 10 has a plurality of enclosed channels 101 therein. The reactor body 10 can have, but not limited to, a cylindrical shape or a polygonal column shape. In an embodiment, each of the enclosed channels 101 is an elongated hollow tube being disposed in the reactor body 10 and penetrating an upper end surface 102 and a lower end surface 103 of the reactor body 10. Moreover, the present invention does not limit the number of the enclosed channels 101.

The upper cap 11 has an inlet port 111 and a recess 112 communicating with the inlet port 111. The upper cap 11 is disposed on the upper end surface 102 of the reactor body 10 through the recess 112, so as to allow the inlet port 111 to communicate with the enclosed channels 101 of the reactor body 10.

The lower cap 12 has an outlet port 121 and a recess 122 communicating with the outlet port 121. The lower cap 12 is disposed on the lower end surface 103 of the reactor body 10 through the recess 122, so as to allow the outlet port 121 to communicate with the enclosed channels 101 of the reactor body 10.

The first conduit plate 13 is disposed between the upper cap 11 and the reactor body 10. In particular, the first conduit plate 13 is disposed on the upper end surface 102 of the reactor body 10 and received in the recess 112 of the upper cap 11. That is, while the upper cap 11 is disposed on the upper end surface 102 of the reactor body 10 through the recess 112, the first conduit plate 13 is sandwiched between the upper cap 11 and the reactor body 10. The first conduit plate 13 is used to guide a precursor 14 injected from the inlet port 111 into the enclosed channels 101 uniformly.

In the first embodiment, the system 1 further has two O-rings 15. The O-rings 15 are disposed between the reactor body 10 and the upper cap 11 and between the reactor body 10 and the lower cap 12, respectively, to enhance the sealing tightness. As such, the enclosed channels 101 are in vacuum (<760 torr).

Figure 1B:
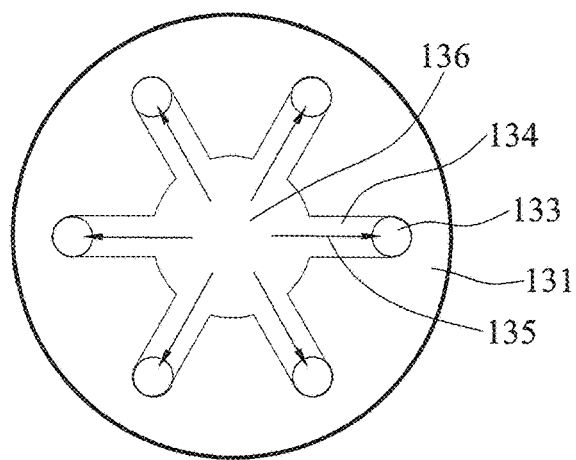
FIG. 1B is a cross-sectional schematic view of a first conduit plate taken along a sectional line C-C' in FIG. 1A.
Figure 1C:
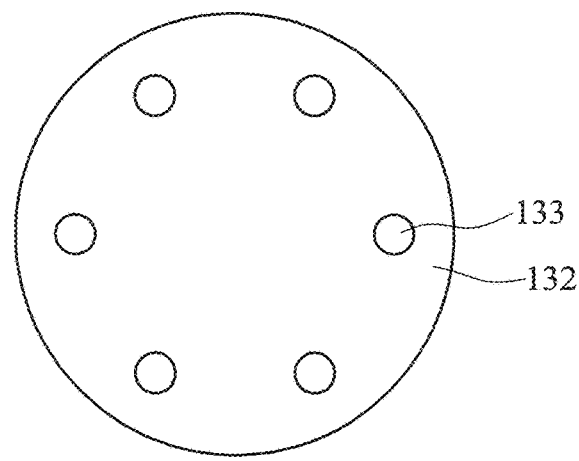
FIG. 1C is a cross-sectional schematic view of the first conduit plate taken along a sectional line B-B' in FIG. 1A.
Figure 1D:
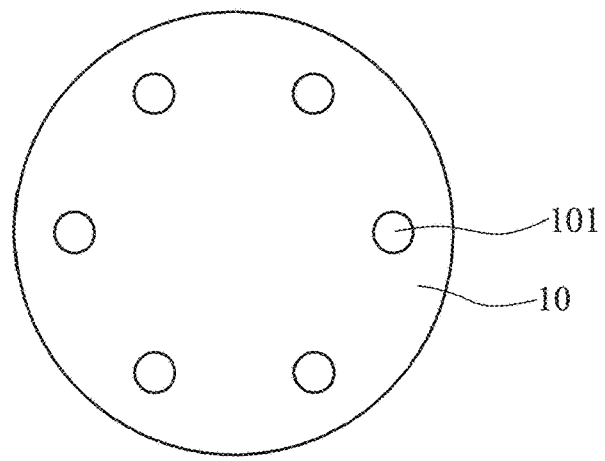
FIG. 1D is a cross-sectional schematic view of a reactor body taken along a sectional line A-A' in FIG. 1A.
Figure 2A:
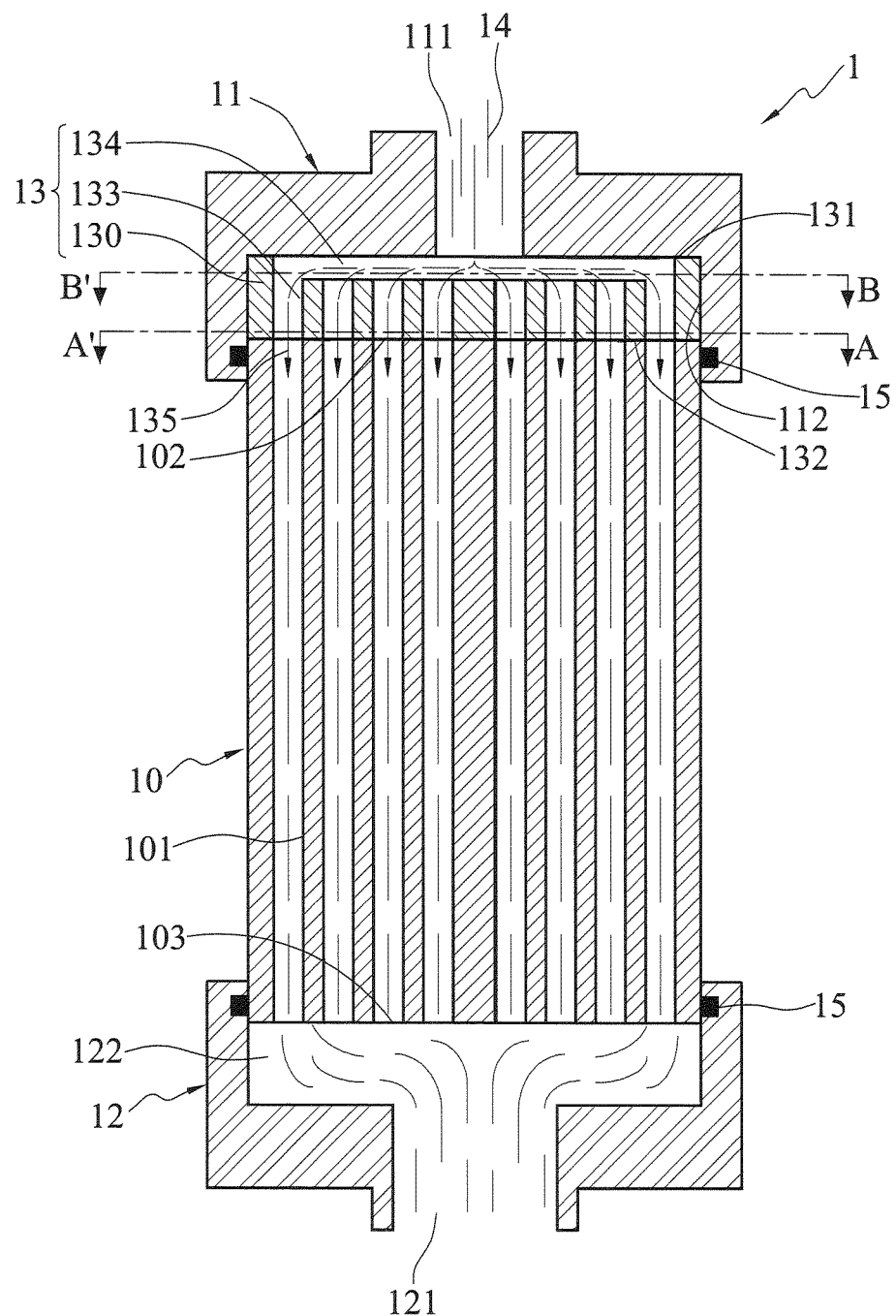
FIG. 2A is a schematic view of the enclosed-channel reactor system in FIG. 1A according to another embodiment of the present invention.
Figure 2B:
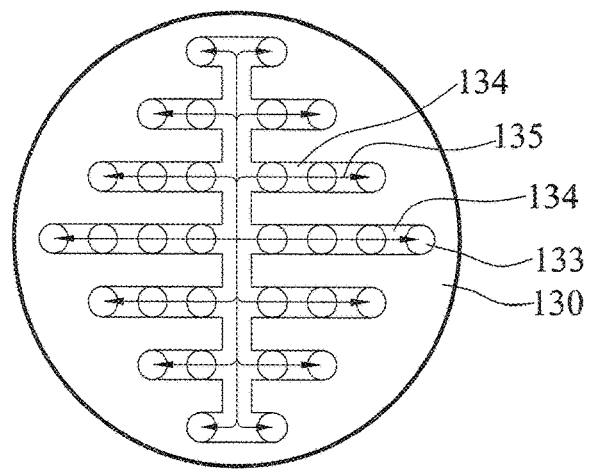
FIG. 2B is a cross-sectional schematic view of a first conduit plate taken along a sectional line B-B' in FIG. 2A.
Figure 2C:
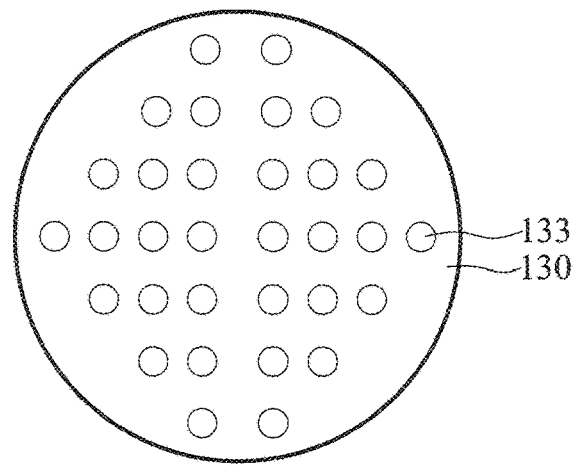
FIG. 2C is a cross-sectional schematic view of the first conduit plate taken along a sectional line A-A' in FIG. 2A.
Figure 2D:
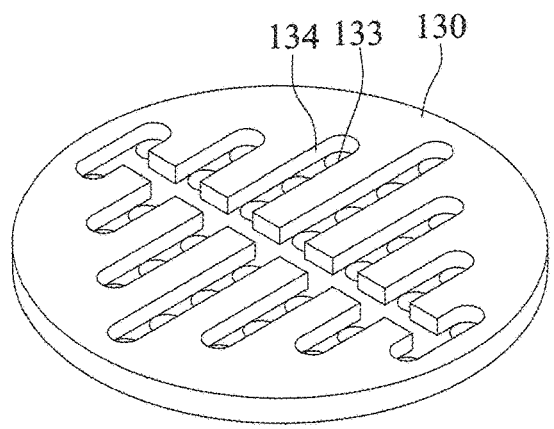
FIG. 2D is a three-dimensional schematic view of the first conduit plate of FIG. 2A.

In the first embodiment, referring to FIGS. 1A to 1D, the first conduit plate 13 has a plate body 130 having an upper surface 131 and a lower surface 132 opposite to the upper surface 131; a plurality of through holes 133 penetrating the upper surface 131 and the lower surface 132 of the plate body 130; and a plurality of conduits 134 concavely formed on the upper surface 131 of the plate body 130. Referring to FIG. 1B, the conduits 134 are arranged in a radial manner, extending from a center of the plate body 130 out to the through holes 133 and communicating between the inlet port 111 of the upper cap 11 and the through holes 133.

In the first embodiment, the first conduit plate 13 further has a circular conduit 136 formed on the upper surface 131 of the plate body 130, corresponding in position to the inlet port 111 of the upper cap 11, and communicating with the conduits 134.

In the first embodiment, the conduits 134 are parallel to the upper surface 131 of the plate body 130. But it should be noted that the present invention is not limited thereto. For example, the conduits 134 can be obliquely formed on the upper surface 131 of the plate body 130, and have a depth that decreases gradually from one end to the other.

According to the enclosed-channel reactor system 1 and the first conduit plate 13 thereof, the precursor 14 injected from the inlet port 111 of the upper cap 11 first reaches the circular conduit 136 of the first conduit plate 13 and then flows along the conduits 134 so as to be guided along directions 135 into the through holes 133. Therefore, the precursor 14 is uniformly guided into the enclosed channels 101.

In another embodiment, referring to FIGS. 2A to 2D, the conduits 134 of the first conduit plate 13 are arranged in a fishbone manner, and the through holes 133 are formed not only communicating with the ends of the conduits 134 as described above, but also at intermediate positions communicating with the conduits 134. However, the present invention is not limited thereto. The descriptions of the other elements in the embodiment are the same as those in the first embodiment, so that they are not further described for brevity.

In a further embodiment, referring to FIGS. 3A to 3E, the enclosed-channel reactor system 1 is provided with a first conduit plate 13 and a second conduit plate 16. The first conduit plate 13 and the second conduit plate 16 are sequentially disposed between the upper cap 11 and the reactor body 10, and disposed in the order of the upper cap 11, the first conduit plate 13, the second conduit plate 16, and the reactor body 10. The first conduit plate 13 differs from that of the first embodiment only in that the conduits 134 are arranged in a crossed manner. The elements, in addition to the second conduit plate 16, in the embodiment are the same as those described in the first example, so that they are not further described for brevity. The following only illustrates the difference between the embodiment and the first embodiment.

Figure 3A:
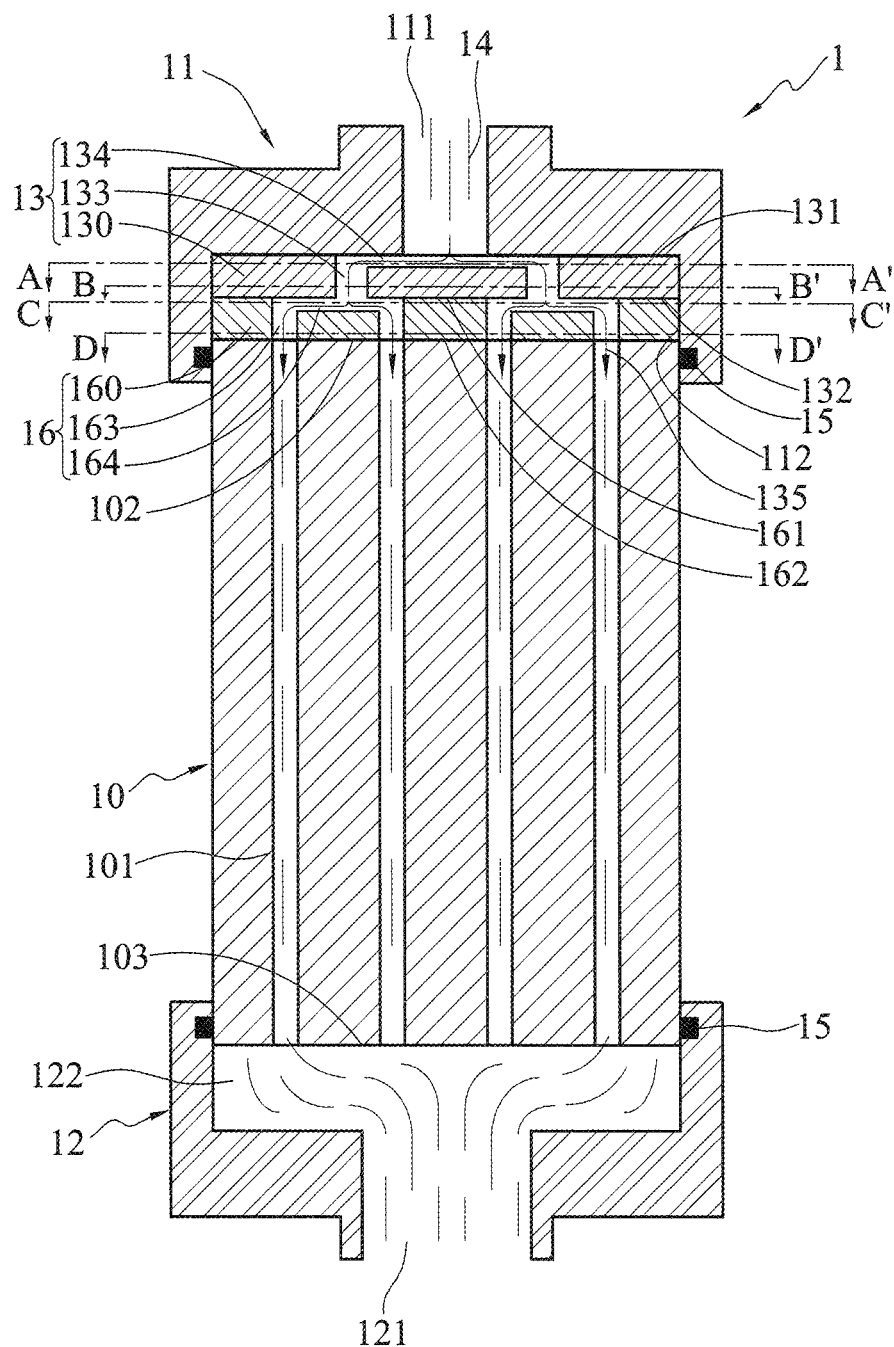
FIG. 3A is a schematic view of the enclosed-channel reactor system in FIG. 1A according to a further embodiment of the present invention.
Figure 3B:
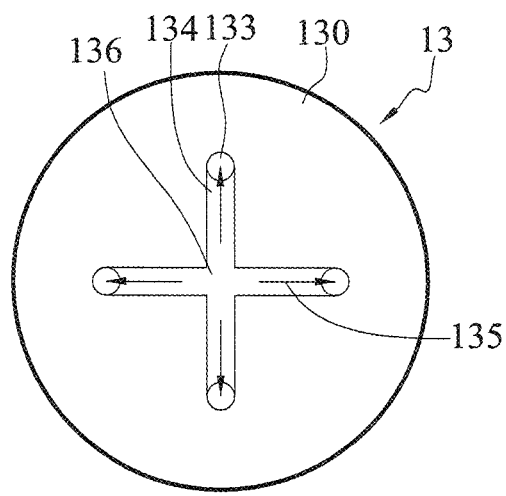
FIG. 3B is a cross-sectional schematic view of a first conduit plate taken along a line A-A' of FIG. 3A.
Figure 3D:
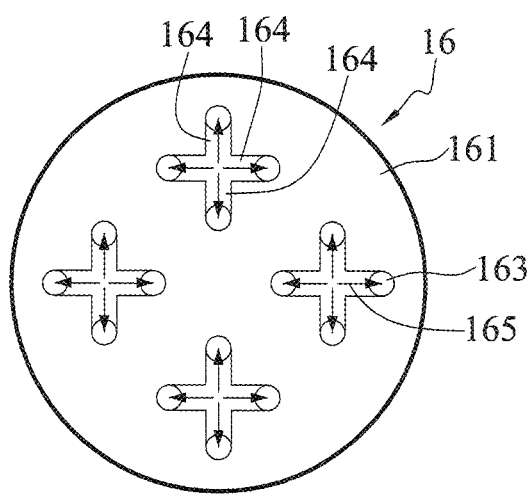
FIG. 3D is a cross-sectional schematic view of a second conduit plate taken along a sectional line C-C' in FIG. 3A.
Figure 3C:
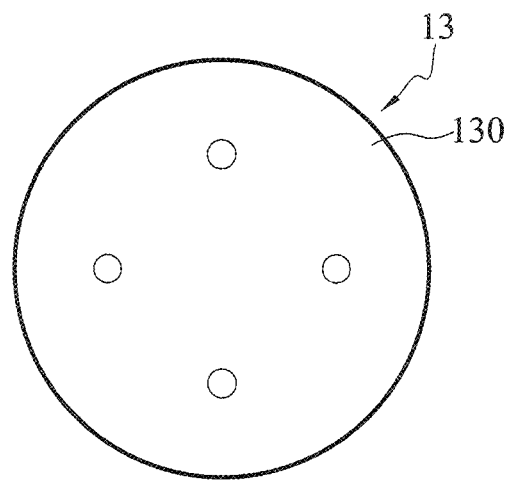
FIG. 3C is a cross-sectional schematic view of the first conduit plate taken along a sectional line B-B' of FIG. 3A.
Figure 3E:
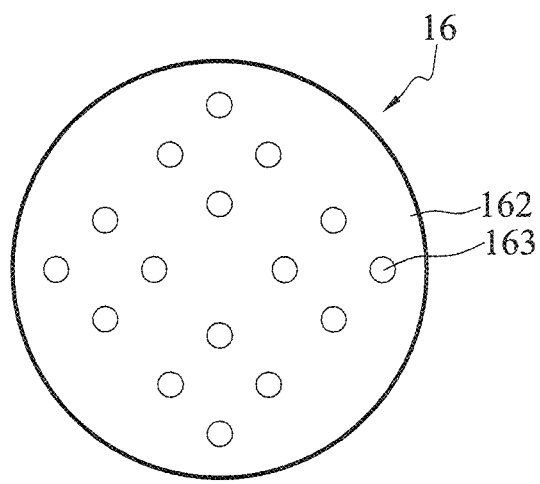
FIG. 3E is a cross-sectional schematic view of the second conduit plate taken along a sectional line D-D' in FIG. 3A.
Figure 3F:
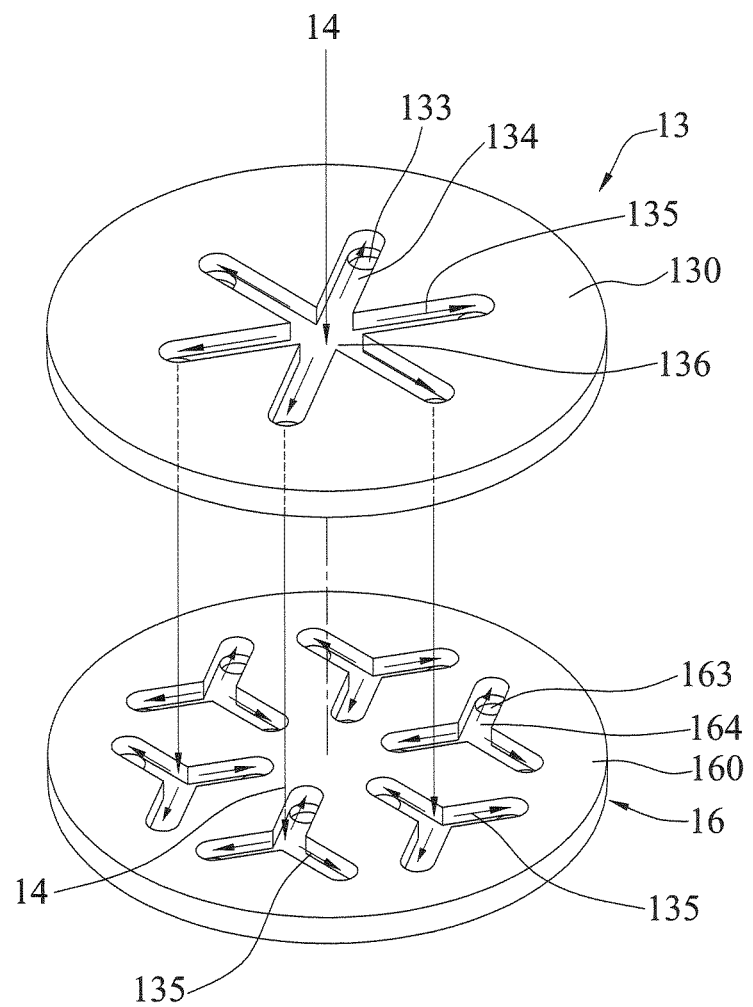
FIG. 3F illustrates a three-dimensional schematic view of the first and second conduit plates according to another embodiment of the present invention.

The second conduit plate 16 has a plate body 160 having an upper surface 161 and a lower surface 162 opposite to the upper surface 161; a plurality of through holes 163 formed corresponding in position to the enclosed channels 101 and penetrating the upper surface 161 and the lower surface 162 of the plate body 160; and a plurality of conduits 164 concavely formed on the upper surface 161 of the plate body 160 and corresponding in position to the through holes 133 of the first conduit plate 13. As such, the precursor 14 injected from the inlet port 111 first reaches the first conduit plate 13, and is then guided along the conduits 134 into the through holes 133, so as to reach the second conduit plate 16. Further, the precursor 14 is guided along the conduits 164 into the through holes 163, so as to be uniformly guided into the enclosed channels 101. The number of the conduits 164 of the second conduit plate 16 is greater than the number of the conduits 134 of the first conduit plate so as to allow the precursor to be guided into the enclosed channels more uniformly through the first and second conduit plates. However, the present invention does not limit the number of the conduit plates or the shape of the conduits on the conduit plates. For example, referring to FIGS. 3B to 3E, the conduits 134 and 164 on the first conduit plate 13 and the second conduit plate 16, respectively, are arranged in a crossed manner. In another embodiment, referring to FIG. 3F, the conduits 134 and 164 are arranged in a radial manner. However, the present invention is not limited thereto. The main spirit of the embodiment is the effect of secondary guiding by the guiding plates.

FIGS. 4A to 4D show the enclosed-channel reactor system 1 according to a second embodiment of the present invention. Referring to FIGS. 4A to 4D, the first conduit plate 13 includes the plate body 130, a though hole 133 and a plurality of conduits 134. The inlet port 111 is located at a side position, instead of a central position of the upper cap 11, and the inlet port 111 is opened in a direction parallel to an axial direction of the upper cap 11 (i.e., gas enters from the side). The remaining technical content is the same as those described for the above enclosed-channel reactor system, such that it is not further provided for brevity.

Figure 4A:
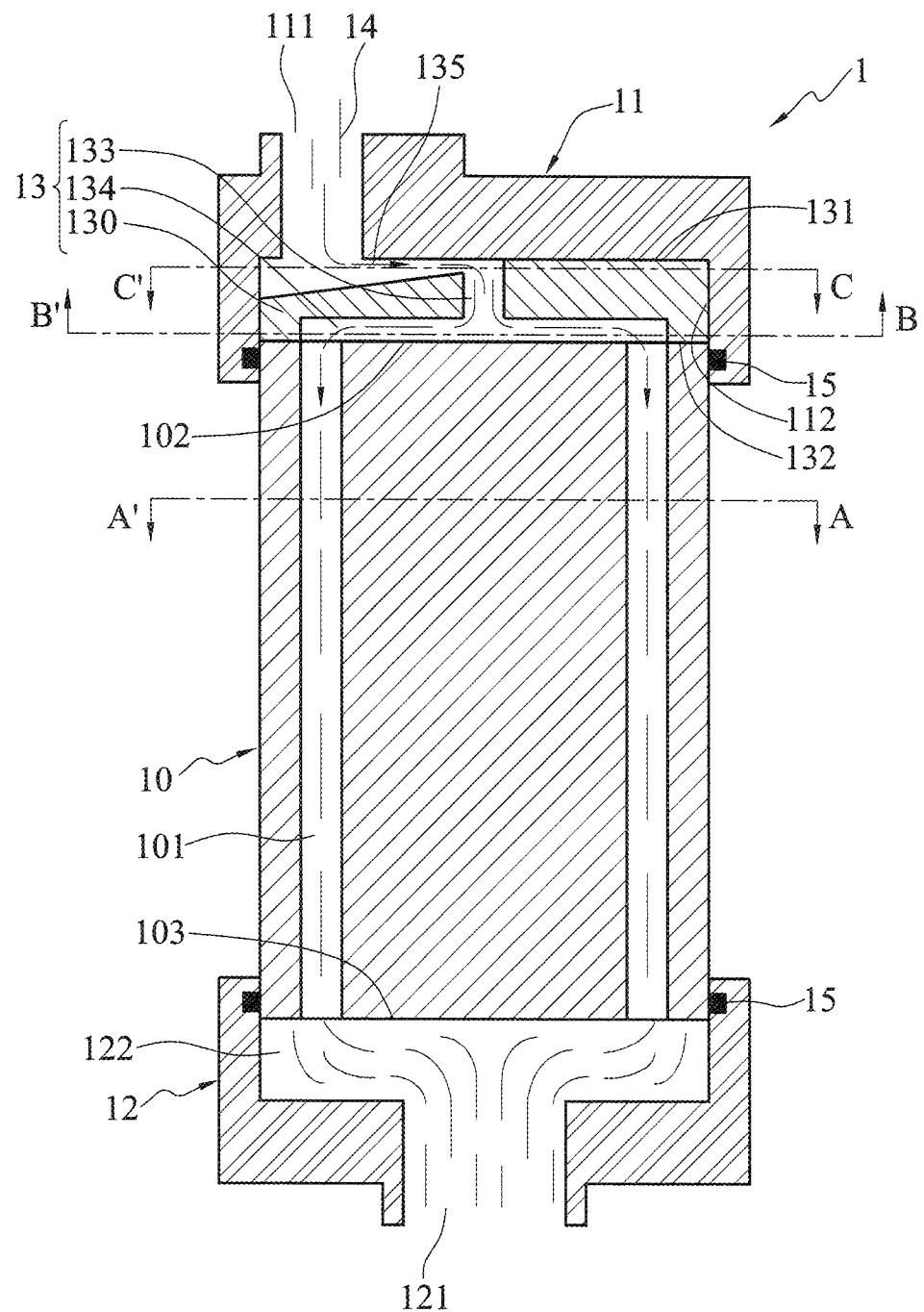
FIG. 4A is a schematic view of an enclosed-channel reactor system according to a second embodiment of the present invention.

The first conduit plate 13 has a plate body 130 having an upper surface 131 and a lower surface 132 opposite to the upper surface 131, the through hole 133 penetrating the upper surface 131 and the lower surface 132 of the plate body 130, and the plurality of conduits 134 concavely formed on the lower surface 132 of the plate body 130. The first conduit plate 13 is disposed between the upper cap 11 and the reactor body 10, and each of the conduits 134 has one end communicating with a corresponding one of the enclosed channels 101, and the other end communicating with the through hole 133. The conduits 134 are arranged on the lower surface 132 of the plate body 130 in a radial manner, as shown in FIG. 4C. In another embodiment, the conduits 134 are arranged on the lower surface 132 of the plate body 130 in a fishbone manner, as shown in FIG. 4C'. The present invention does not limit the arrangement of the conduits.

In the embodiment, the through hole 133 is positioned at a center of the plate body 130 of the first conduit plate 13. Further, the conduits 134 can be parallel to the lower surface 132 of the plate body 130. Alternatively, each of the conduits 134 is formed by having a depth that gradually decreases from the communication with the through hole 133 towards the communication with the enclosed channels 101. That is, each of the conduits 134 has a depth that decreases gradually from the through hole 133 toward the end communicating with the corresponding one of the plurality of enclosed channels 101. The present disclosure is not limited thereto.

Figure 4B:
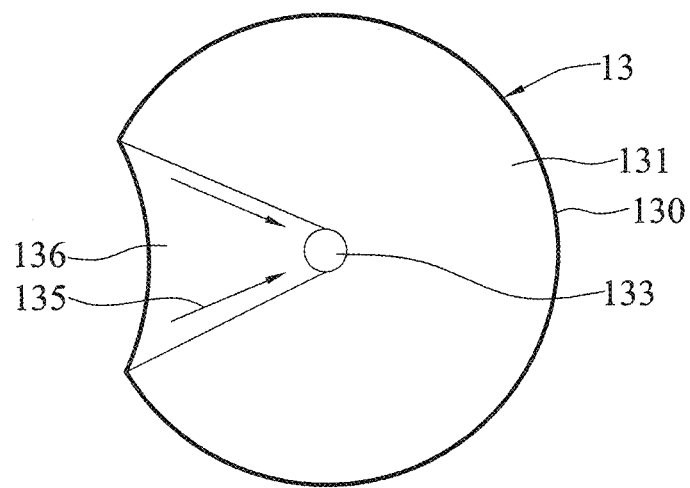
FIG. 4B is a cross-sectional schematic view of a first conduit plate taken along a sectional line C-C' in FIG. 4A.
Figure 4B:
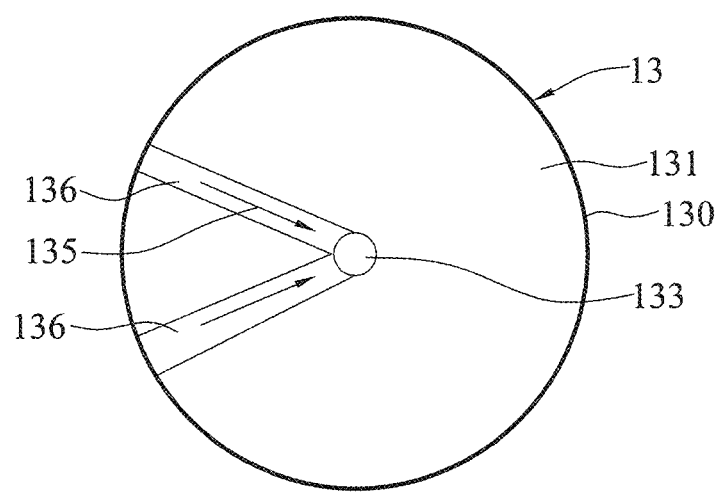
Figure 4C:
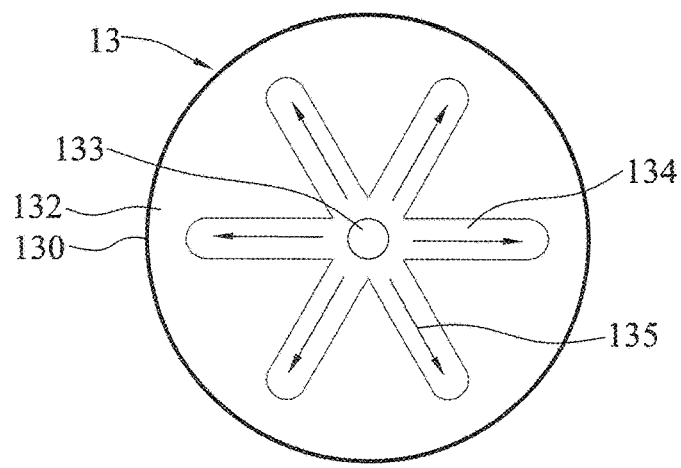
FIG. 4C is a cross-sectional schematic view of the first conduit plate taken along a sectional line B-B' in FIG. 4A.
Figure 4C:
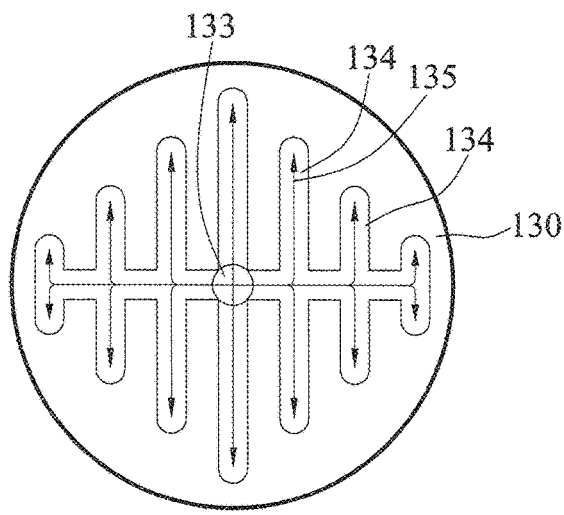
Figure 4D:
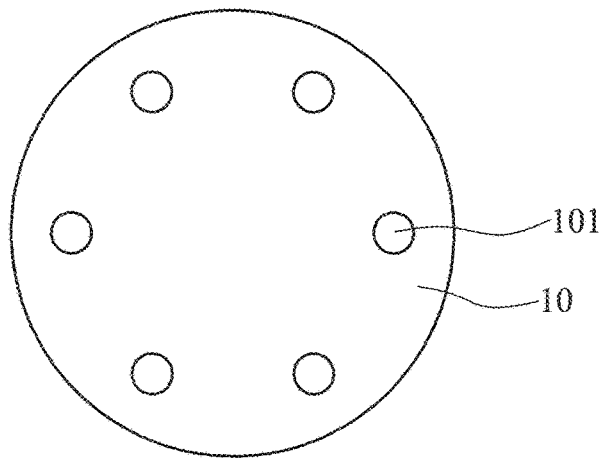
FIG. 4D is a cross-sectional schematic view of a reactor body taken along a sectional line A-A' in FIG. 4A.

In the embodiment, referring to FIG. 4B, the first conduit plate 13 further has a conduit 136 formed on the upper surface 131 of the plate body 130 for flow collection. The conduit 136 communicates with the through hole 133, and extends outwardly from the through hole 133 in an arc shape. As such, the precursor is guided along directions 135, so as to be collected in the through hole 133. The conduit 136 corresponds in position to the inlet port 111 of the upper cap 11. The present invention does not limit the positions of the conduit 136 and the inlet port 111 of the upper cap 11.

In another embodiment, referring to FIG. 4B', the first conduit plate 13 further has at least two conduits 136 formed on the upper surface 131 of the plate body 130. Different from the arc-shaped conduit 136 of FIG. 4B, the conduits 136 of FIG. 4B' have an elongated shape, which extend linearly from an edge of the first conduit plate 13 to the through hole 133. During an A-P-B-P ALD cycle process, the two conduits 136 provide separate paths for transporting the precursors A and B to the through hole 133, and thereby preventing the precursors A and B from reacting with each other. However, the present invention does not limit the positions and the amount of the conduits 136.

Figure 5:
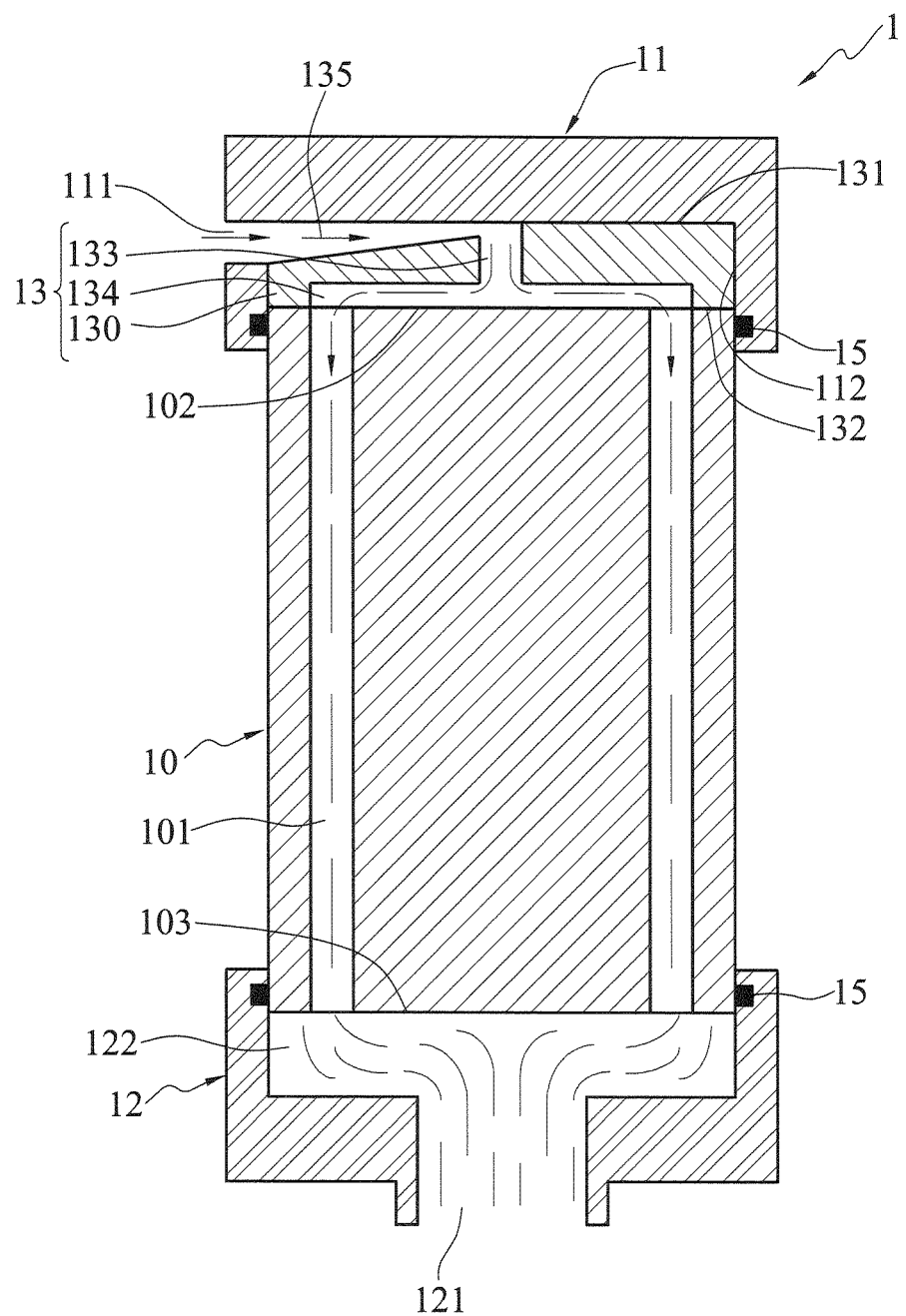
FIG. 5 is a schematic view of an enclosed-channel reactor system according to a third embodiment of the present invention.
Figure 6A:
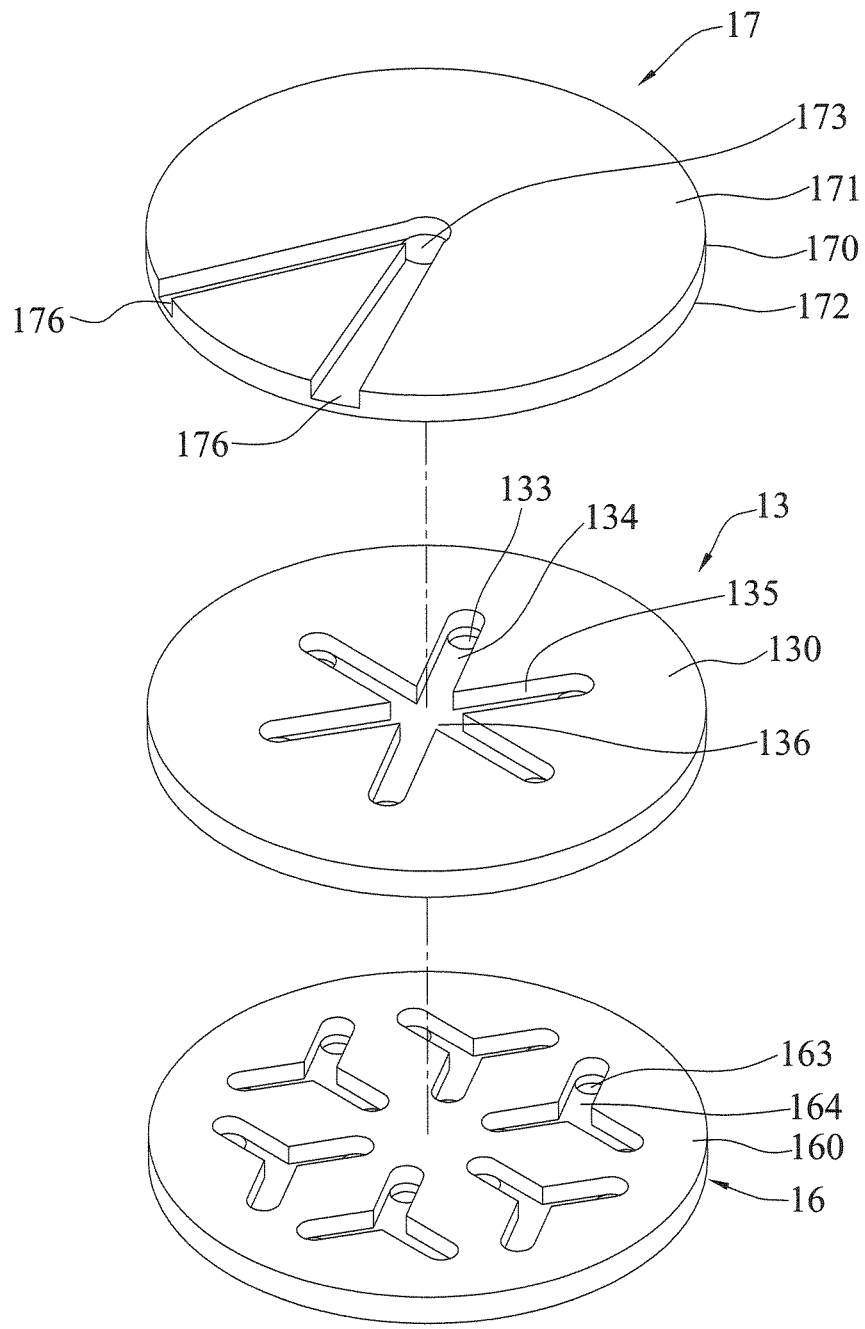
FIG. 6A illustrates a three-dimensional schematic view of a first conduit plate, a second conduit plate and a convergence plate of an enclosed-channel reactor system according to an embodiment of the present invention.
Figure 6B:
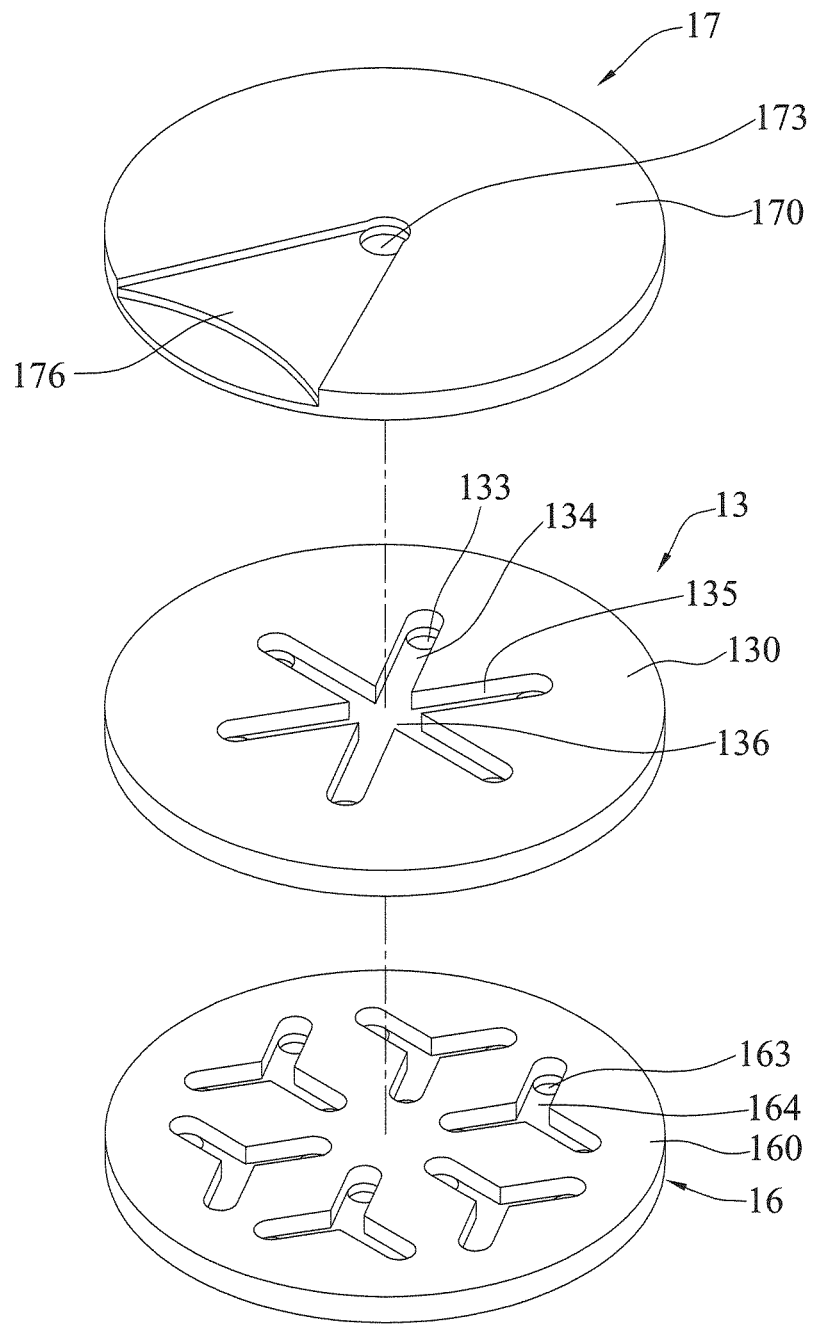
FIG. 6B illustrates a three-dimensional schematic view of the first conduit plate, the second conduit plate and the convergence plate of an enclosed-channel reactor system according to another embodiment of the present invention.
Figure 7A:
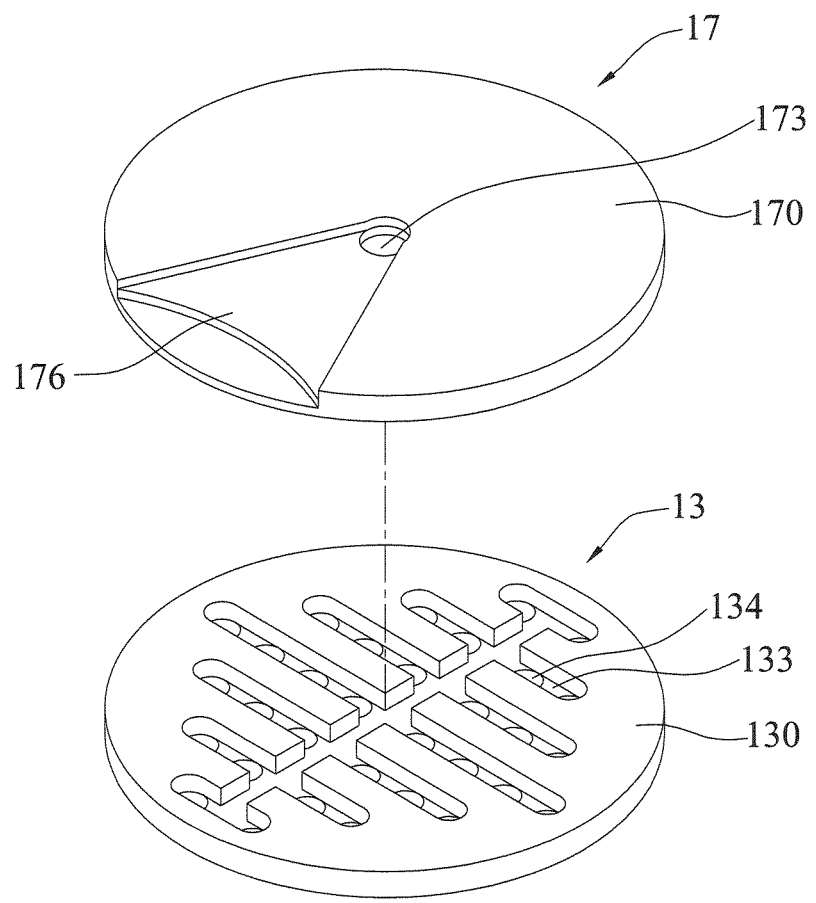
FIG. 7A illustrates a three-dimensional schematic view of a first conduit plate and a convergence plate of an enclosed-channel reactor system according to an embodiment of the present invention.
Figure 7B:
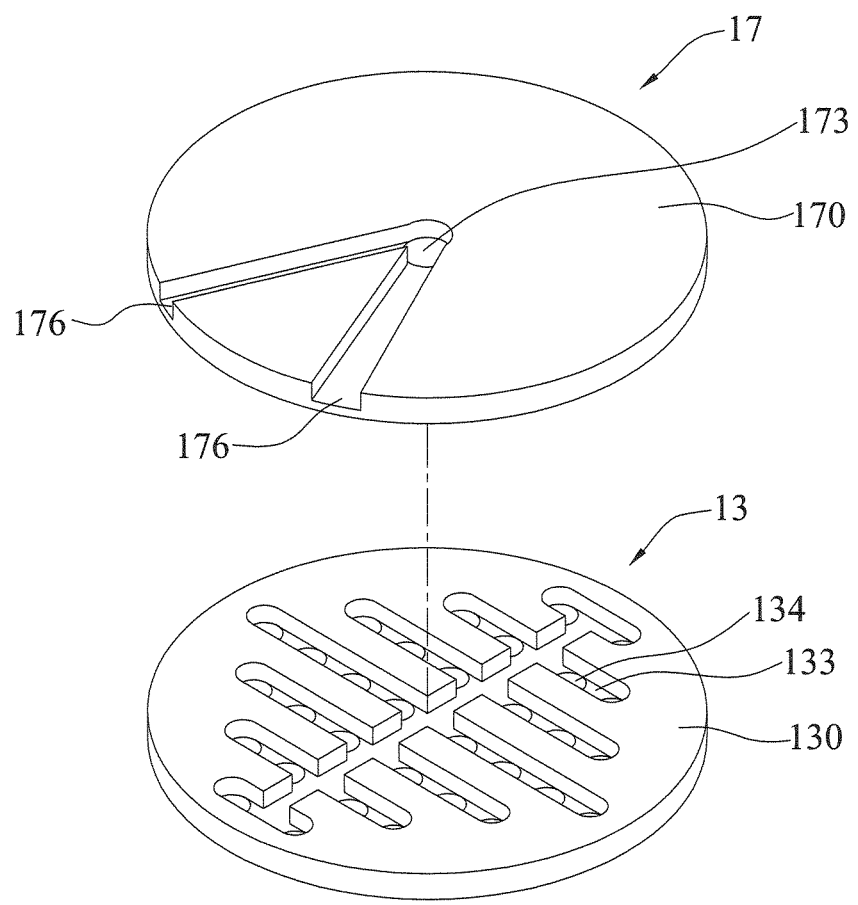
FIG. 7B illustrates a dimensional schematic view of the first conduit plate and the convergence plate of an enclosed-channel reactor system according to another embodiment of the present invention.

Moreover, the direction of the opening of the inlet port 111 of the upper cap 11 in the enclosed-channel reactor 10 is not limited. Referring to the second embodiment shown in FIG. 4A, the inlet port 111 is opened in the direction parallel to the axial direction of the upper cap 11. In particular, the inlet port 111 is formed on a surface of the upper cap 11 opposite to the recess 112. But it should be noted that the present invention is not limited thereto. In a third embodiment of FIG. 5, the inlet port 111 is opened in a direction parallel to a radial direction of the upper cap 11. In particular, the inlet port 111 is formed on a side surface of the upper cap 11. In addition to the difference in the direction of the opening of the inlet port 111, the remaining technical content of the third embodiment is the same as that described for the above enclosed-channel reactor system, so that it is not further described for brevity.

In other embodiments, referring to FIGS. 6A to 7B, the enclosed-channel reactor system according to the present invention further has a convergence plate 17. The convergence plate 17 has a plate body 170 having an upper surface 171 and a lower surface 172 opposite to the upper surface 171, and a through hole 173 positioned at a center of the plate body 170 and penetrating the upper surface 171 and the lower surface 172 of the plate body 170. The convergence plate 17 is disposed between the first conduit plate 13 and the upper cap 11. Further, at least a conduit 176 communicating with the through hole 173 is formed on the upper surface 171 of the convergence plate 170. The conduit 176 can extend outwardly from the through hole 173 in a fan shape or have an elongated shape extending linearly from an edge of the convergence plate 17 to the through hole 173. The conduit 176 corresponds in position to the inlet port 111 of the upper cap 11.

In other words, the function of the conduit 136 on the upper surface 131 of the first conduit plate 13 in the second and third embodiments is separated in the present embodiment by providing the convergence plate 17. As such, the convergence plate 17 can be used in combination with the first conduit plate 13 of the first embodiment and the second conduit plate 16 of the first embodiment to guide the precursor into the enclosed channels uniformly. Also, the inlet port 111 can be formed at any position of the upper cap 11, provided that the opening direction of the inlet port 111 is parallel to the axial direction of the upper cap 11. Further, the conduit 176 of the convergence plate 17 can be omitted, and only the through hole 173 is formed on the convergence plate 17. In addition, the convergence plate 17 can be used in combination with a first conduit plate that has a plurality of first conduits concavely formed on a lower surface of the plate body (as shown in FIG. 4A) but does not have a second conduit formed on an upper surface of the plate body. The first conduits can even penetrate the plate body of the first conduit plate.

Figure 8A:
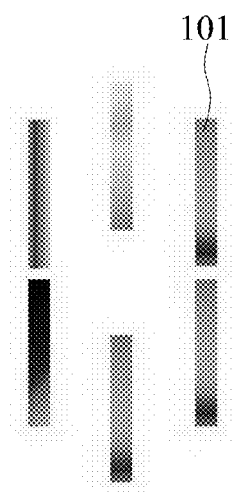
FIGS. 8A to 8C illustrate photographs of plated thin films fabricated by using an ALD system.
Figure 8B:
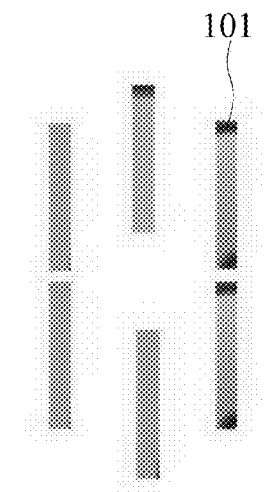
Figure 8C:
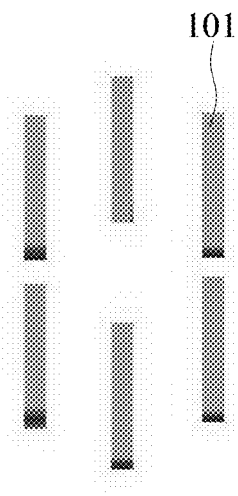

FIGS. 8A to 8C illustrate photographs of deposited thin films fabricated by an ALD system, wherein gray gradients are used to indicate whether a thin film is uniform. The more the grey gradients, the less uniform the thin film is. FIG. 8A is a photograph of a thin film formed by an ALD system that does not use a carrier gas or a conduit plate, FIG. 8B is a photograph of a thin film formed by an ALD system that uses a carrier gas but does not use a conduit plate, and FIG. 8C is a photograph of a thin film formed by an ALD system that uses both a carrier gas and a conduit plate according to the present invention.

In the present experiment, $Ta_2O_5$ is grown on a silicon substrate having a length of 10 cm. The operating parameters are shown as follows.

| Precursor | Precursor temperature (° C.) | Pulse time (s) | Purge time (s) | Number of cycles | Working pressure (torr) | Substrate temperature (° C.) |
|---|---|---|---|---|---|---|
| $Ta[N(CH_3)_2]_5$ (PDMAT) | 90 | 2 | 10.0 | 800 | 1 | 250 |
| Water | 25 | 0.2 | 10.0 | | | |

Referring to FIGS. 8A to 8C, the thin film of FIG. 8C that is formed by the ALD system using the carrier gas and the conduit plate according to the present invention is more uniform than those of FIGS. 8A and 8B.

Figure 9:
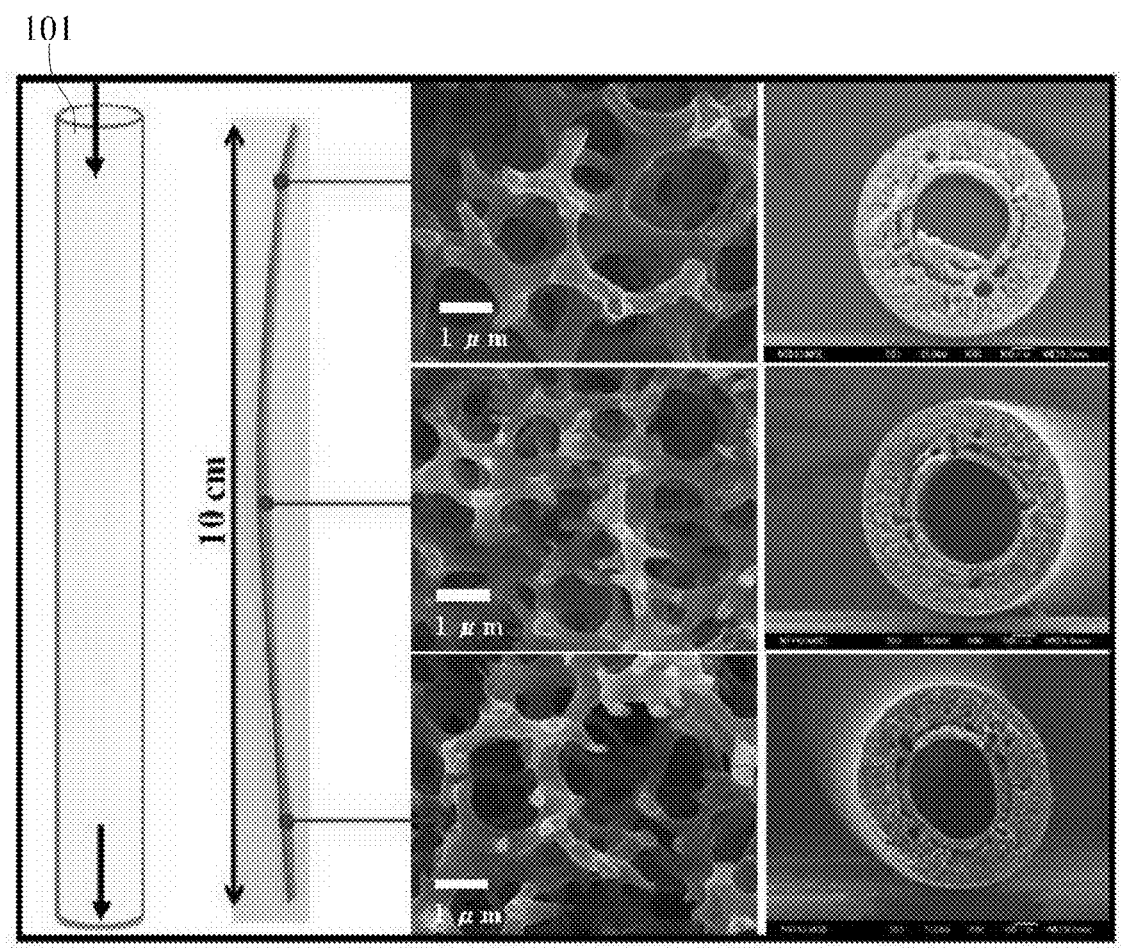
FIG. 9 illustrates photographs and SEM images showing the growth of a thin film on a single hollow fiber by using the enclosed-channel reactor system according to the present invention.

FIG. 9 illustrates photographs and SEM images showing growth of a thin film of $TiO_2$ on a polysulfone (PSF) hollow fiber template fabricated by the ALD system using the carrier gas and the conduit plate according to the present invention. The operating parameters are shown as follows.

| Precursor | Precursor temperature (° C.) | Pulse time (s) | Purge time (s) | Number of cycles | Working pressure (torr) | Substrate temperature (° C.) |
|---|---|---|---|---|---|---|
| $TiCl_4$ | 25 | 3.5 | 7 | 400 | 1 | 100 |
| Water | 25 | 0.5 | 7 | | | |

Referring to FIG. 9, $TiO_2$ is grown on the entire nanoporous hollow fiber template uniformly by the ALD system using the carrier gas and the conduit plate according to the present invention (whether it is formed on the upper, middle or lower section of the nanoporous hollow fiber template), thus achieving an excellent coverage and deposition uniformity.

Therefore, the enclosed-channel reactor system and the conduit plate thereof according to the present invention allow precursors to be guided into the enclosed channels uniformly. As such, collisions of precursor molecules with substrates are increased to enhance reactivity and reduce pulse time. Also, the present invention improves the diffusion efficiency of precursors and increases the growth rate of thin films. Furthermore, the present invention reduces the consumption of precursors and consequently reduces the fabrication cost. In addition, the present invention is applicable to a nanostructured substrate having a high aspect ratio for deposition of uniform thin films. Also, the present invention is applicable to an ALD process using low vapor pressure precursors.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An enclosed-channel reactor system, comprising:
a reactor body disposed with a plurality of enclosed channels;
an upper cap disposed at one end of the reactor body, and having an inlet port communicating with the plurality of enclosed channels;
a lower cap disposed at the other end of the reactor body and opposite to the upper cap, and having an outlet port communicating with the plurality of enclosed channels;
at least two O-rings disposed between the reactor body and the upper cap and between the reactor body and the lower cap, respectively, for enhancing a sealing tightness;
a first conduit plate disposed between the upper cap and the reactor body; and
a convergence plate disposed between the upper cap and the first conduit plate for guiding a precursor injected from the inlet port into the first conduit plate and the plurality of enclosed channels uniformly,
wherein the first conduit plate comprises:
a first plate body having a first upper surface and a first lower surface opposite to the first upper surface;
a plurality of first through holes penetrating the first upper surface and the first lower surface of the first plate body; and
a plurality of first conduits concavely formed on the first upper surface of the first plate body,
wherein the convergence plate comprises:
a convergence plate body having an upper surface and a lower surface opposite to the upper surface;
a convergence through hole positioned at a center of the convergence plate body and penetrating the upper surface and the lower surface of the convergence plate body in an axial direction; and
a single convergence conduit communicating with the convergence through hole and formed on the upper surface of the convergence plate body of the convergence plate extending from an edge of the convergence plate to the convergence through hole in a wide-to-narrow fan shape in a lateral direction,
wherein the convergence through hole and the single convergence conduit of the convergence plate communicate with the inlet port of the upper cap and the first through holes and the first conduits of the first conduit plate, and the axial direction is perpendicular to the lateral direction, and
wherein the single convergence conduit on the upper surface of the convergence plate body of the convergence plate corresponds in position to the inlet port of the upper cap, and the inlet port is opened in a direction parallel to the axial direction of the upper cap.

2. The enclosed-channel reactor system of claim 1, wherein the first conduit plate further comprises a circular conduit formed on the first upper surface of the first plate body thereof, and corresponding in position to the inlet port of the upper cap and communicating with the plurality of first conduits.

3. The enclosed-channel reactor system of claim 1, wherein the plurality of first conduits are parallel to the first upper surface of the first plate body.

4. The enclosed-channel reactor system of claim 1, wherein the plurality of first conduits are arranged in a radial manner.

5. The enclosed-channel reactor system of claim 1, wherein the plurality of first conduits are arranged in a fishbone manner.

6. The enclosed-channel reactor system of claim 1, further comprising a second conduit plate, which comprises:
a second plate body having a second upper surface and a second lower surface opposite to the second upper surface;
a plurality of second through holes penetrating the second upper surface and the second lower surface of the second plate body; and
a plurality of second conduits concavely formed on the second upper surface of the second plate body;
wherein the second conduit plate is disposed between the first conduit plate and the reactor body, and the number of the second conduits of the second conduit plate is greater than the number of the first conduits of the first conduit plate.

7. The enclosed-channel reactor system of claim 1, wherein the inlet port is opened in a direction parallel to a radial direction of the upper cap.

8. The enclosed-channel reactor system of claim 1, wherein the first conduit plate comprises:
a plate body having an upper surface and a lower surface opposite to the upper surface;
a through hole penetrating the upper surface and the lower surface of the plate body; and
a plurality of conduits concavely formed on the lower surface of the plate body, and each having one end communicating with a corresponding one of the plurality of enclosed channels of the reactor body and the other end communicating with the through hole, such that the plurality of conduits are arranged in a radial or fishbone manner.

9. The enclosed-channel reactor system of claim 8, wherein the through hole is positioned at a center of the plate body of the first conduit plate.

10. The enclosed-channel reactor system of claim 8, wherein each of the conduits has a depth that decreases gradually from the end communicating with the through hole toward the end communicating with the corresponding one of the plurality of enclosed channels.

11. The enclosed-channel reactor system of claim 8, wherein the first conduit plate further comprises a conduit formed on the upper surface of the plate body thereof, and the conduit communicates with the through hole and extends outwardly from the through hole in an arc shape.

12. The enclosed-channel reactor system of claim 11, wherein the conduit on the upper surface of the plate body of the first conduit plate corresponds in position to the inlet port of the upper cap.

13. The enclosed-channel reactor system of claim 12, wherein the inlet port is opened in a direction parallel to the axial direction of the upper cap.

14. The enclosed-channel reactor system of claim 12, wherein the inlet port is opened in a direction parallel to a radial direction of the upper cap.

15. The enclosed-channel reactor system of claim 8, wherein at least two conduits are formed on the upper surface of the plate body of the first conduit plate, and extend linearly from an edge of the first conduit plate to the through hole.

16. The enclosed-channel reactor system of claim 8, further comprising a second conduit plate, which comprises:
- a plate body having an upper surface and a lower surface opposite to the upper surface;
- a plurality of through holes penetrating the upper surface and the lower surface of the plate body; and
- a plurality of conduits concavely formed on the upper surface of the plate body;
- wherein the second conduit plate is disposed between the first conduit plate and the reactor body, and the number of the conduits of the second conduit plate is greater than the number of the conduits of the first conduit plate.

17. The enclosed-channel reactor system of claim 8, further comprising a convergence plate, which comprises:
- a plate body having an upper surface and a lower surface opposite to the upper surface; and
- a through hole positioned at a center of the plate body and penetrating the upper surface and the lower surface of the plate body;
- wherein the convergence plate is disposed between the upper cap and the first conduit plate.

* * * * *